United States Patent
Tilton et al.

(10) Patent No.: US 7,788,939 B2
(45) Date of Patent: Sep. 7, 2010

(54) AZEOTROPE SPRAY COOLING SYSTEM

(75) Inventors: Charles L. Tilton, Colton, WA (US);
Donald E. Tilton, Colton, WA (US);
Bruce A. Smetana, Colton, WA (US);
Angela R. Maehren, Pullman, WA (US);
Philip W. Appel, Spokane, WA (US);
Randall T. Palmer, Liberty Lake, WA (US)

(73) Assignee: Parker-Hannifin Corporation, Cleveland, OH (US)

( * ) Notice: Subject to any disclaimer, the term of this patent is extended or adjusted under 35 U.S.C. 154(b) by 1145 days.

(21) Appl. No.: 11/183,333

(22) Filed: Jul. 16, 2005

(65) Prior Publication Data
US 2008/0028782 A1 Feb. 7, 2008

Related U.S. Application Data

(60) Provisional application No. 60/588,862, filed on Jul. 15, 2004.

(51) Int. Cl.
*F25D 23/12* (2006.01)
(52) U.S. Cl. .................................... 62/259.2; 252/67
(58) Field of Classification Search ............ 62/259.2, 62/114; 252/67; 165/104.11
See application file for complete search history.

(56) References Cited

U.S. PATENT DOCUMENTS

| | | | |
|---|---|---|---|
| 3,965,971 A | 6/1976 | Roggenkamp | |
| 4,390,396 A * | 6/1983 | Koblenzer | 202/166 |
| 4,552,910 A | 11/1985 | Deubzer et al. | |
| 5,089,070 A | 2/1992 | McAndrew | |
| 5,349,831 A | 9/1994 | Daikoku et al. | |
| 5,880,931 A * | 3/1999 | Tilton et al. | 361/690 |
| 6,152,215 A | 11/2000 | Niggemann | |
| 6,215,682 B1 | 4/2001 | Akamatsu | |
| 6,334,311 B1 | 1/2002 | Kim et al. | |
| 6,366,462 B1 | 4/2002 | Chu et al. | |
| 6,374,907 B1 | 4/2002 | Tousignant et al. | |
| 6,389,225 B1 * | 5/2002 | Malinoski et al. | 392/479 |
| 6,415,619 B1 | 7/2002 | Bash et al. | |
| 6,484,521 B2 * | 11/2002 | Patel et al. | 62/171 |
| 6,772,603 B2 | 8/2004 | Hsu et al. | |

(Continued)

FOREIGN PATENT DOCUMENTS

EP 0072145 2/1983

(Continued)

OTHER PUBLICATIONS

International Searching Authority, International Search Report and Written Opinion of the International Searching Authority, PCT/US05/24770, Jul. 15, 2005.

(Continued)

*Primary Examiner*—Melvin Jones
(74) *Attorney, Agent, or Firm*—Michael S. Neustel

(57) ABSTRACT

An azeotrope spray cooling system for utilizing an azeotrope coolant for improving the performance of a spray cooling system. An azeotrope coolant is utilized within a two-phase thermal management system for thermally managing one or more heat producing devices. The characteristics of the azeotrope coolant may be adjusted for various types of thermal management applications by altering the components of the azeotrope coolant.

21 Claims, 3 Drawing Sheets

U.S. PATENT DOCUMENTS

| | | |
|---|---|---|
| 6,857,283 B2 * | 2/2005 | Tilton et al. ................ 62/259.2 |
| 2002/0009585 A1 | 1/2002 | Albert et al. |
| 2002/0064642 A1 | 5/2002 | Albert et al. |
| 2004/0055329 A1 * | 3/2004 | Mathias et al. ................ 62/611 |
| 2004/0089008 A1 * | 5/2004 | Tilton et al. ................ 62/259.2 |

FOREIGN PATENT DOCUMENTS

| | | |
|---|---|---|
| EP | 1380799 | 1/2004 |
| JP | 61014282 | 1/1986 |

OTHER PUBLICATIONS

Dow Corning, Cleaning and Removal Fluids, <available at http://www.dowcorning.com/content/etronics/etronicsfluids/etronics_fluid_osov.asp>, Apr. 24, 2005.

Dow Corning, Products: Dow Corning(R) OS-120, <available at http://www.dowcorning.com/applications/Product_Finder/PF_details.asp?11=009&prod=02680181&type=PROD&pg=00001126>, year:2000.

Dow Corning, Product Information: Dow Corning OS-120 Fluid, May 1, 1998, Ref. No. 10-1199-01, year: 1997.

Dow Corning, Products: Dow Corning OS-10, <available at http://www.dowcorning.com/applications/Product_Finder/pf_products.asp?prod=02341476&type=prod&searchfor="os-10", year: 2000.

Dow Corning, Product Information: Dow Corning OS-10,OS-20, OS-30 Fluids, May 1, 1998, Ref. No. 10-1198-01.

3M IPC, Product Information: Fluorinert Electronic Liquid FC-87, May 2000, Ref. No. 98-0212-2311-4 (HB).

Dupont, About Vertrel, <available at http://www.dupont.com/vertrel/about/index.html>, May 17, 2005.

Dupont, Technical Information: DuPont Vertrel XF Specialty Fluid, Feb. 2004, Ref. No. K-04159.

Dupont, Technical Information: DuPont Vertrel XMS Plus Specialty Fluid, Feb. 2004, Ref. No. K-04175.

Micro Care Corp., Is Bromothane an Azeotrope? What is an Azeotrope? Why is that Important?, <available at http:bromothane.com/FAQ.Q30_Azeotropes.html, Feb. 23, 2004.

European Patent Office, Supplementary European Search Report, European Application No. EP 05773675, Dec. 16, 2009, 8 pages.

Eurpoean Patent Office, Supplementary European Search Report, European Application No. EP05773675, Apr. 14, 2010, 9 Pages.

* cited by examiner

AZEOTROPE SPRAY COOLING SYSTEM

CROSS REFERENCE TO RELATED APPLICATIONS

We hereby claim benefit under Title 35, United States Code, Section 119(e) of U.S. provisional patent application Ser. No. 60/588,862 filed Jul. 15, 2004 which is still pending. The 60/588,862 application is hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to liquid coolant for two-phase liquid cooling systems and more specifically, it relates to an azeotrope spray cooling system that utilizes an azeotrope coolant for improving the performance of a spray cooling system.

2. Description of the Related Art

Any discussion of the prior art throughout the specification should in no way be considered as an admission that such prior art is widely known or forms part of common general knowledge in the field.

Modern electronic devices (e.g. microprocessors, circuit boards, power supplies, and other electronic devices) have increased thermal management requirements. Conventional dry thermal management technology (e.g. fans, vents) simply is not capable of efficiently cooling modern high-end electronics.

Spray cooling technology is being adopted today as the most efficient option for thermally managing electronic systems. U.S. Pat. No. 5,220,804 entitled High Heat Flux Evaporative Spray Cooling to Tilton et al. describes the earlier versions of spray technology, as applied to electronics cooling. U.S. Pat. No. 6,108,201 entitled Fluid Control Apparatus and Method for Spray Cooling to Tilton et al. also describes the usage of spray technology to cool components on a printed circuit board. Spray cooling utilizes phase changing for thermally managing one or more electronic devices. Most spray cooling systems utilize a single component coolant. Spray cooling as used herein, may be a spot spray cooling system as described by '804 to Tilton, wherein the coolant is directed towards modules thermally attached to heat producing devices; or may be a global spray cooling system such as described us U.S. Pat. No. 5,880,931 wherein the cooling fluid is directly applied to the electronics to be cooled.

Spray cooling provides the possibility of removing high heat fluxes with electronic safe fluids that are not optimally suited for use in thermal management systems. The coolant typically used within a spray cooling system is a dielectric fluid (e.g. hydrofluorethers) having a low vaporization temperature at standard atmospheric pressure. One common brand of dielectric coolant for two-phase thermal management systems is manufactured by Minnesota Mining and Manufacturing Company (3M®) under the federally registered trademark Fluorinert®. Although a dielectric fluid is required for use in global cooling systems, it is also suitable for spot cooling systems, as the fluid does not create the risk of system failures, as is the case with water utilizing systems. While Fluorinert is useful for the thermal management of electronic devices, it unfortunately has some relatively poor fluid properties for this use. For example, the thermal conductivity value (0.057 $Wm^{-1}K^{-1}$) at standard atmospheric conditions limits its ability to conduct heat from a cooling surface of a heat-producing device. For comparison, air has a thermal conductivity value of 0.0267 $Wm^{-1}K^{-1}$ and water, being much more thermally conductive, has a typical value of 0.611 $Wm^{-1}K^{-1}$.

More recently, liquid thermal management systems have utilized a mixture of two different components, such as different varieties of Fluorinert, wherein the first component evaporates at a first temperature and a second component may or may not evaporate at a second temperature, wherein the first temperature and the second temperature are different from one another, often referred to as zeotropes. It is important to note that blends of the varieties of Fluorinert are not an azeotropic mixture since the components boil at different points.

An azeotrope is a fluid mixture of two or more components that change phase at nearly the same pressure and temperature. In addition, an azeotrope maintains the same composition as it is boiled (i.e. the vapor has the same composition as the liquid). The components of an azeotrope therefore cannot be separated through simple distillation as with most liquid mixtures, particularly mixtures within the Fluorinert family of fluids. Typically, the component comprising the bulk of the azeotropic mixture is referred to as the base component. Azeotropes are a common byproduct when distilling ethanol, and have been widely used as cleaning fluids, such as a mixture of siloxane and alcohol (e.g. OS-120 brand produced by DOW CORNING CORPORATION).

Some azeotropes are pressure sensitive and some are pressure insensitive, meaning that they are only azeotropes for a limited range of pressures. Azeotropes can be positive or negative; boiling at a temperature above or below that of one of the constituents. The components can be completely miscible or entirely immiscible or anywhere in between. All known immiscible azeotropes are negative boiling.

Several methods exist to separate the components of an azeotrope. One such method is referred to as pressure swing distillation (used for pressure sensitive azeotropes) where the pressure is typically changed to a value away from the point where the activity coefficients of the constituents cross (thereby becoming a zeotropic mixture). Azeotropes are also commonly separated by adding material separating agents (MSAs) to the mixture. This is more commonly used for pressure insensitive azeotropes since for this case pressure swing distillation is ineffective. MSAs often bond to one of the components of the azeotrope to form intermediate azeotropes resulting in the ultimate separation of the initial azeotrope. Constituents can then be removed using common distillation techniques, but ultimately the MSA must be separated. Typically, this is done using filtration.

Though this is not a comprehensive description of all azeotropes or their characteristics, all of these attributes pose potential advantages for use in two-phase liquid cooling systems.

BRIEF SUMMARY OF THE INVENTION

The present invention provides a new azeotrope two-phase liquid cooling system construction wherein the same can be implemented for utilizing an azeotrope coolant for improving the performance of a typical spray cooling system.

The general purpose of the present invention, which will be described subsequently in greater detail, is to provide a new azeotrope spray cooling system that has many of the advantages of the prior art spray cooling systems and many novel features that result in a new azeotrope spray cooling system which is not anticipated, rendered obvious, suggested, or even implied by any of the prior art spray cooling systems, either alone or in any combination thereof.

To attain this, the present invention generally comprises a two-phase thermal management system for thermally managing one or more heat producing devices and an azeotrope coolant within. The characteristics of the azeotrope coolant may be optimized above that of a pure component fluid and/or adjusted for various types of thermal management applications by altering the components of the azeotrope mixture. In addition, an azeotrope can be implemented to tailor the fluid properties at various points within the closed loop system.

There has thus been outlined, rather broadly, the more important features of the invention in order that the detailed description thereof may be better understood, and in order that the present contribution to the art may be better appreciated. There are additional features of the invention that will be described hereinafter and that will form additional subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of the description and should not be regarded as limiting.

A primary object of the present invention is to provide an azeotrope spray cooling system that will overcome the shortcomings of the prior art devices.

A second object is to provide an azeotrope spray cooling system for utilizing an azeotrope coolant for improving the performance of a spray cooling system.

Another object is to provide an azeotrope spray cooling system that allows for the altering and improvement of liquid coolant properties such as but not limited to boiling points, heat of vaporization at boiling point, thermal conductivity, flammability, specific gravity, viscosity, density, latent heat of vaporization, specific heat, surface tension, and other properties.

An additional object is to provide an azeotrope spray cooling system that is capable of utilizing various azeotropes and or MSAs.

A further object is to provide an azeotrope spray cooling system that is capable of tailoring the internal pressure to the surrounding atmospheric pressure.

A still further object is to provide an azeotrope spray cooling system that implements an azeotrope that has fluid properties tailored to be an azeotrope at specific areas inside the closed loop system, and a zeotrope in other areas.

A still further object is to provide an azeotrope spray cooling system that is capable of dynamically tailoring the azeotrope for properties specific to localized areas inside the closed loop system.

Other objects and advantages of the present invention will become obvious to the reader and it is intended that these objects and advantages be within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

An azeotrope coolant is utilized within a two-phase thermal management system 10 for thermally managing one or more heat producing devices. The characteristics of the azeotrope coolant may be optimized above that available for a pure fluid and/or adjusted for various types of thermal management applications by altering the components of the azeotrope coolant. This may be done actively within the closed loop system, for example through the insertion and extraction of an MSA. Azeotrope coolant characteristics and properties that may be optimized and/or adjusted include but are not limited to boiling points, thermal conductivity, flammability, flashpoint, specific gravity, viscosities, density, latent heat of vaporization, specific heat, surface tension, dielectric strength, and other characteristics.

B. Two-Phase Thermal Management System

Figure 1:
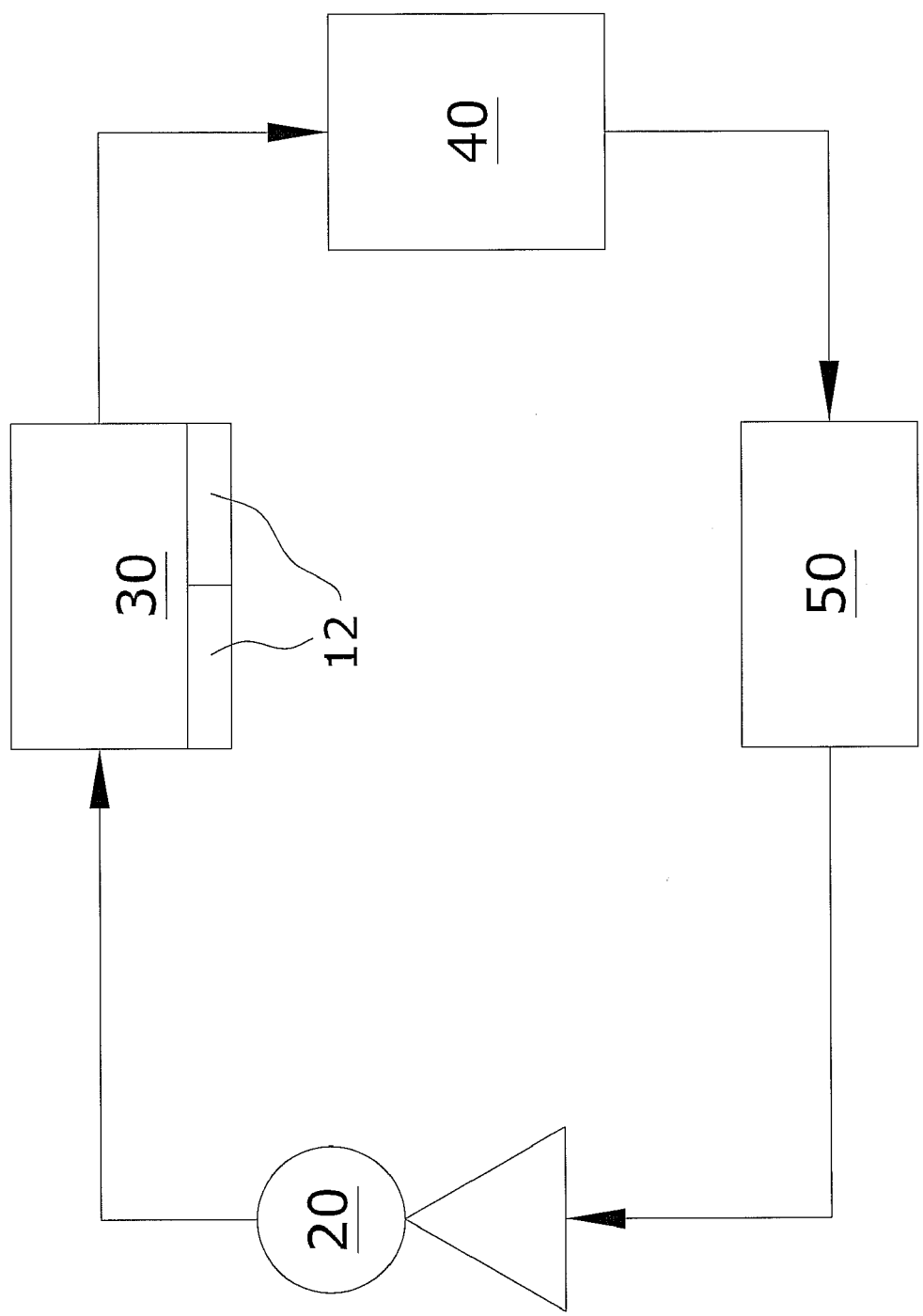
FIG. 1 is a block diagram of an exemplary two-phase thermal management system for the present invention.

FIG. 1 illustrates a two-phase thermal management system 10 comprised of an exemplary closed loop spray cooling system. The two-phase thermal management system 10 may be comprised of various liquid thermal management systems that utilize phase changing to thermally manage one or more heat producing devices. Examples of suitable two-phase thermal management systems 10 for the present invention include but are not limited to spray cooling systems, pool boiling systems, flow boiling systems, jet impingement cooling systems, falling-film cooling systems, parallel forced convection systems, microchannel, mini-channel, and curved channel cooling systems, and capillary pumped loop systems.

For illustration purposes only, a two-phase thermal management system 10 will be utilized to discuss the design, manufacture, structure, functionality, operation and advantages of the present invention. However, the present invention is not limited in scope to a two-phase thermal management system 10 and the discussion of the same should not in any way limit the scope of the claims.

A two-phase thermal management system 10 is typically comprised of at least one pump 20, at least one coolant reservoir 50 fluidly connected to the draw side of the pump 20, at least one thermal management unit 30 fluidly connected to the pressure side of the pump 20, and at least one heat exchanger 40 fluidly connected between the thermal management unit 30 and the coolant reservoir 50. A return manifold may also be used for collecting the coolant from one or more thermal management units 30. The thermal management unit 30 may be comprised of at least one spray module that is in thermal communication with the heat producing device 12 (e.g. electronic device). U.S. Pat. No. 6,857,283 illustrates an exemplary closed loop spray cooling system and is hereby incorporated by reference.

One type of system known in the art is referred to as a globally cooled system, which is one that cools all of the electronics on a global level, such as is described by U.S. Pat. No. 5,880,931, which illustrates an exemplary global spray cooling system and is hereby incorporated by reference. In this type of system the individual electronics components processors, memory chips, resistors, capacitors, and other electronic components that make up an electronics circuit, as well as the circuit card on which they reside and communicate, are all primarily contained within the two phase cooling system, and are wetted (or are not prevented from being wetted) by the cooling fluid.

C. Azeotrope Coolant

The coolant utilized in the present invention is comprised of an azeotropic mixture having a base component and at least one added component. More particularly, the azeotrope coolant is comprised of two or more components that change phase at approximately the same temperature and pressure. The phase change can be either evaporation or condensation.

By implementing the correct added components to the base component, the user is able to form an azeotrope coolant that has improved properties over that of the base component resulting in a more effective cooling fluid. For example, the boiling point, thermal conductivity, flammability, flashpoint, specific gravity, viscosities, density, latent heat of vaporization, specific heat, surface tension, and other properties can be altered for the specific thermal management application in which the azeotrope coolant will be used. Since most fluid properties vary with the state of the fluid, such as pressure and temperature, the properties above can be optimized and/or adjusted for a particular range of system operating conditions.

Figure 2:
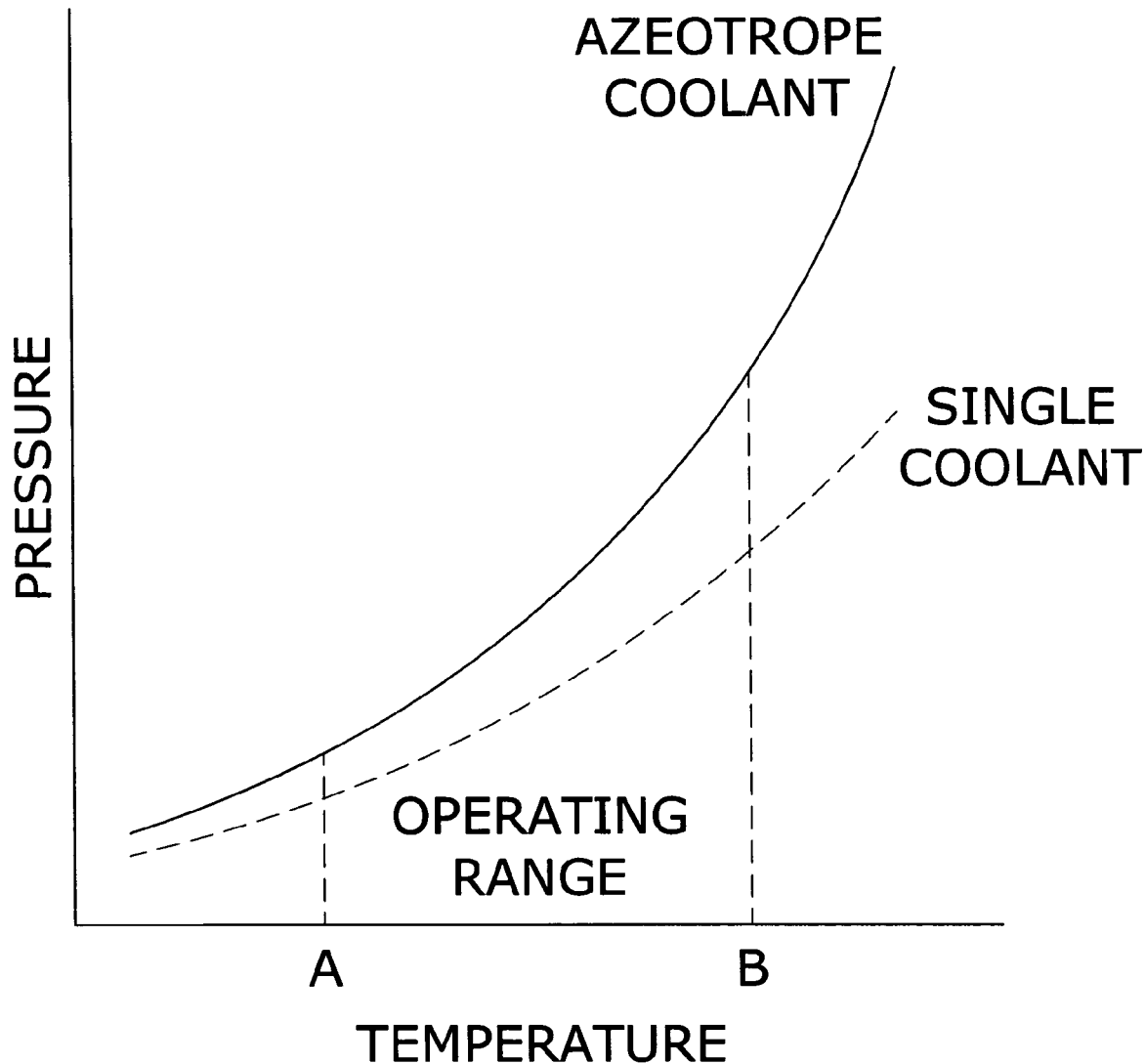
FIG. 2 is a chart showing different saturation curves for two different fluids.

For example, the slope of a pressure-temperature curve that describes the phase change of a fluid can be flattened or made steeper using an azeotropic mixture, which can improve system performances across a range of system operating conditions. As shown in FIG. 2, a typical single component fluid may have a saturation curve described by the dotted line. An azeotropic mixture, formed by the same base fluid, may behave as described by the solid line as shown in FIG. 2. The solid line is steeper in the operating range of the cooling system. This type of scenario can provide system improvements such as to minimize the thermal effects of pressure drop in the return side of the two-phase liquid cooling system (between thermal management unit 30 and heat exchanger 40). At the heat exchanger 40, the temperature of the fluid determines the pressure inside (point A). Moving backward through the cooling system towards thermal management unit 30, fluid pressure drops because of surface irregularities of the tubing, manifold structure, quick-disconnect fittings, valves, and the like, all of which create increases in pressure. The result can be an increased boiling point (point B) at the thermal management unit 30, which then results in increased temperatures of the components to be cooled. Given that a pressure drop of a system may be 2 pounds per square inch for a given spot cooling system, the temperature rise of the pure fluid dotted line of FIG. 2 can result in a component temperature rise of 5 to 10 degrees Celsius. A steeper curve, such as that of a hypothetical azeotrope mixture also shown in FIG. 2, may only result in a 2 to 3 degree temperature rise of the components to be cooled. Generally it is advantageous to reduce the temperature of the components to be cooled in reference to a given ambient heat rejection temperature as it allows electronic components to continue to function at higher ambient temperatures (e.g. a desert). Electronic component reliabilities increase with decreases in operating temperatures, and power consumption of an electronic component decreases with temperature while providing constant computing/electrical performance.

Although the above description is provided as one potential way to optimize a two-phase thermal management system by means of an azeotropic mixture, the present invention is not limited to such. Though the effects of discrete fluid properties on spray cooling system performance are not perfectly known, it is known that fluid properties do affect performance of individual sub-systems and components. For example, in the use of spray cooling, the size and momentum of the droplets affect system performance. Too small of droplets, or too little momentum of the droplets can cause dispensed droplets to be entrained by the escaping vapor of the cooling surface, and thus not reach the cooling surface. Too large, or too much momentum of the droplets can create system inefficiencies and poor cooling performance due to splashing at the cooling surface.

The fluid properties, along with nozzle geometry, strongly influence the size and momentum of the droplets impinging the cooling surface of a spray-cooling surface. An exemplary source of information on droplet formation is available in the book Atomization and Sprays by Lefebvre (December 1988). In this case, an azeotropic mixture may be optimized for droplet size and momentum, above that of the pure base fluid, for use in a spray cooling system, and for a given nozzle geometry. Fluid properties that affect the spray are at least surface tension, density, and viscosity. With this embodiment and according to the present invention, azeotrope cooling fluids provide the means of optimizing the spray and resulting performance of thermal management systems.

Figure 3:
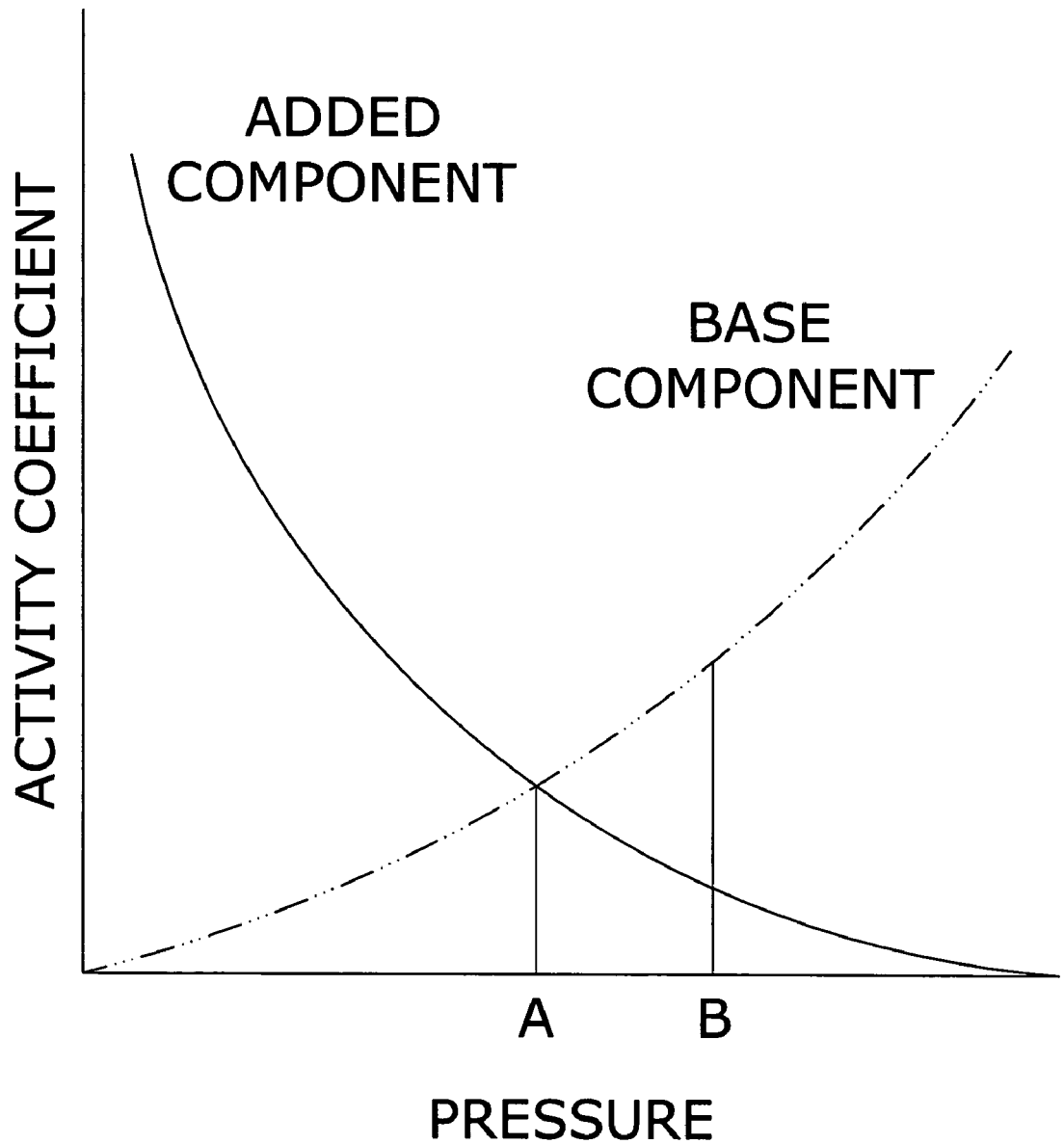
FIG. 3 is a chart showing the change in activity coefficients for two components of a typical pressure dependent azeotrope.

Droplet size and momentum also play a role in the ability to entrain vapor into the main flow of a side spray-narrow gap spray configuration such as is described in U.S. patent application Ser. No. 10/096,340, which is hereby incorporated by reference. A droplet size of approximately 20-30 µm has been shown to be particularly effective in vapor re-entrainment in this configuration. What has been discovered is that as the quality of fluid increases (i.e. ratio of vapor to liquid) at the entrance to the narrow gap the heat transfer coefficient also increases. One advantage that azeotropes offer is the ability, not only to potentially form smaller droplets through a given atomizer geometry, but in the case of a pressure dependent azeotrope, to tailor the fluid to be an azeotrope at a pressure as measured inside the condenser (Point A, FIG. 3), and in the same system be a zeotropic mixture as the fluids are circulated to the spray module, where a significant pressure increase is realized (Point B, FIG. 3). It then becomes easily possible to entrain vapor due to the now zeotropic mixture at the spray module pressure (Point B, FIG. 3). By incorporating an azeotrope with one component that flashes as the spray expands is still another way to increase the initial fluid quality. A still further method of increasing the sprayed vapor quality is to utilize an azeotrope that releases dissolved gasses (e.g. air, $CO_2$, Nitrogen, Helium, etc.) as it is sprayed. With this embodiment and according to the present invention, azeotrope cooling fluids provide the means of optimizing the interaction of spray with vapor and gases within thermal management systems.

Not all fluid properties of an azeotropic mixture may have positive effects on two-phase cooling. The contributions of each fluid property can be grossly positive or negative, with the goal of the resulting fluid being net positively optimized. For instance, it is known that the interaction of a fluid on the surface a component is a function of the fluid properties of that fluid and the surface properties of the surface material. A fluid wets out (spreads to form a thin layer) on a surface if the surface energy of the cooling surface is greater than the surface tension of the fluid. If the surface tension of the fluid is greater than the surface energy of the material of the cooling surface then the fluid will have a contact angle and create drops on the cooling surface. It is well known that the effectiveness of a condenser can be improved by making a non-wetting condition between the cooling fluid and the walls of the condenser. System level optimization can be difficult when certain fluid properties have positive effects in one area of the system and negative effects in another—surface tension of the fluid in the atomizers of a spray module versus in the condenser for example. The goal of an optimal two-phase liquid cooling fluid is to optimize the most performance gaining fluid properties for a given system. Through the use of azeotropic mixtures, optimal fluids can be created for particular systems. For example, if the ability to remove high heat fluxes is more important than the size of the condenser used, i.e. space is less of a driver than performance, then surface tension of the fluid can be optimized for the spray and not for condensation. In the event that the size of the condenser is the driver, the surface tension of the fluid can be optimized using well-known condenser principles and formulas. With this embodiment and according to the present invention, azeotrope cooling fluids provide the means of optimizing performances of individual components, sub-systems and areas of thermal management systems.

Yet another method of tailoring a fluid for a particular application is in relation to system pressures at a given environmental operating temperature and pressure. Because the system will have either a positive or a negative pressure within, in comparison to standard atmospheric pressure, it is possible to have fluid leak or permeate from the system, or to have outside fluids such as air enter the closed loop cooling systems. Both cases are undesirable. With azeotropic mixtures, and saturation curve optimization, it is possible to create a fluid that results in reduced pressure differentials between parts of the cooling system and the environment of the system. The result is reduced leakage rates and permeation. For example, for a system running in standard atmospheric pressures (14.6 psia) at a fluid temperature of 50° C., a pure fluid may change phase at a pressure of 18 psia at 50° C. The result is a difference in pressure between the system and the environment of 3.6 psia. Using mixtures, the same base fluid can have its boiling point altered so that the new fluid changes phase at a pressure of 14.6 psia with a temperature of 50° C. The new difference in pressure between the system and environment would be negligible resulting in less fluid loss and permeation. Other benefits can result with reduced system pressure differences such as weight savings due to reduced structural requirements of the system components. It is more practical to create a fluid mixture having optimal fluid properties than try to engineer a single component fluid. With this embodiment and according to the present invention, azeotrope cooling fluids provide the means of optimizing pressures within one or more areas of thermal management systems.

A major advantage of two-phase cooling systems such as spray cooling over that of single phase cooling systems such as described by U.S. Pat. No. 5,731,954 is that of energy efficiency. Wherein single-phase water based systems may require a flow rate of over a liter per minute per 100 watt processor, spray cooling systems by Isothermal Systems Research, Inc. are able to provide the same level or better cooling of 100 watt processors with a flow rate of less than 80 milliliters/min of flow. The spray cooling systems require much less energy to operate and provide significant system advantages for applications such as datacenters. Although it is possible to achieve some and certain of the advantages of the present invention using zeotropes, that is mixtures that have two distinct boiling points, azeotropic mixtures provide system efficiency advantages over that of zeotropes. Implementing mixtures with two distinct boiling points results in the first component removing heat via vaporization (i.e. efficient two-phase mode of cooling), and the other component providing cooling by means of the less efficient single phase cooling, as it does not reach a state creating evaporation, or if it does, it does so at an elevated temperature. Azeotropic mixtures are ideal for most applications—zeotropic mixtures may be suitable for some applications and less than ideal in others. This is even true for applications within a single system—azeotropes may be ideal for most cooling system components (pumps, condensers, atomizers, heat extraction, etc.) whereas zeotropic mixtures may be suitable for some components and less than ideal for others and particularly in the system condenser. With this embodiment and according to the present invention, azeotrope cooling fluids provide the means of optimizing the efficiencies of thermal management systems.

Suitable base components for use in the azeotrope coolant include but are not limited to methylsiloxane, siloxane (e.g. OS-10 brand siloxane manufactured by DOW CORNING CORPORATION), hydrofluorocarbons, and water. Suitable added components for use in the azeotrope coolant include but are not limited to alcohol, isopropyl alcohol, ethanol, methanol, trans-1,2-dichloroethylene, or benzene. The added component may have a thermal conductivity greater than 0.05 watts per meter Kelvin such as alcohol.

Various families of fluids can be made and used as well—families of azeotropes where the base component is water, families mixing a flammable component into a non-flammable base component, a mixture of a perfluorinated base fluid with a non-perfluorinated fluid, a mixture of a non-dielectric into a dielectric base, mixtures containing bases of alcohol, ether, or a solvent (e.g. acetone, MEK, Xylene, or etc.), fluoroiodocarbon fluids, halons, and so on. Though this list is not exhaustive, it is known that many combinations of fluids are possible, and most present certain benefits to two-phase liquid cooling.

A known example of a suitable azeotropic mixture is comprised of >60% hexamethylsiloxane and 10-30% of an alcohol. This azeotropic mixture is commercially available from DOW CORNING CORPORATION under the "OS-120" trademark. In the OS-120 azeotropic mixture, the base component is hexamethylsiloxane, which can be directly utilized as a coolant in a two-phase thermal management system 10. However, the added component comprised of an alcohol combined with the hexamethylsiloxane creates a new fluid that has improved latent heat of vaporization values, which is known to be desirable in certain two-phase thermal management systems 10. The net effect of latent heat of vaporization is that less fluid mass is required to remove a given amount heat.

OS-120 is particularly well suited for use with thermal management systems such as those used to cool the electronic systems found in hybrid electric and full electric vehicles. As described by U.S. Patent Publication No. 2002/0130565, also assigned to the current applicant, motor electronics and power conversion/control electronics in electric vehicles have significant thermal challenges. The closed loop two-phase thermal management system 10 may be configured to thermally manage one or more electrical devices of an electrically powered vehicle. Power electronics cooled by spray cooling are able to be smaller, less expensive, require fewer materials, provide improved efficiencies, and have longer lives. Unlike the fluids that are used in computing type applications, datacenters for example, automotive applications are more tolerant of fluids having flashpoints. The thermal advantages of methylsiloxane outweigh the use of a fluid having a flashpoint of −3° C. The addition of alcohol, to form an azeotrope, increases the thermal performance of the fluid while only dropping the flashpoint of the fluid by 1° C. An exemplary liquid cooling system for use in power electronics is shown in FIG. 1. In this embodiment of the present invention, global spray cooling (such as the type exemplified by U.S. Pat. No. 5,880,931) is desirable because extremely high heat fluxes may be absorbed across complex shaped materials. Because of the flammable nature of the fluid, a non-oxidizing gas is inserted into the spray chamber, such as $CO_2$, nitrogen, helium, or argon for example, which keeps the fluid from flashing in the case of an electronics failure. Wherein Fluorinert systems, which do not have a flashpoint and thus can acceptably contain air within the spray chamber, some fluids and azeotropic mixtures may be acceptable for certain applications by use of a non-oxidizing displacement gas. Because some gases are soluble in the cooling fluid and thus cause increased system pressures, it may be desirable to remove air and/or gases from the cooling fluid prior to use with a spray cooling system. Dry nitrogen, for example, can then be inserted into the spray chamber providing both system safety and increasing system pressures just enough to keep the pump(s) from cavitating.

Another suitable azeotropic mixture may be comprised of a hydrofluorocarbon fluid along with another component such as isopropyl alcohol, ethanol, methanol or trans-1,2-dichloroethylene. A suitable hydrofluorocarbon fluid is manufactured and sold under the registered trademark VERTREL® by E.I. DU PONT DE NEMOURS AND COMPANY, INC. Vertrel, which is very similar to OS-10 and OS-120, is marketed and used primarily as a solvent for use as a circuit board cleaning solvent.

Non-dielectric base components may also be utilized within the azeotrope coolant. For example, water may be utilized as the base component with benzene added for lowering the boiling point or as another example; ethanol may be mixed with water and used as the coolant.

D. Operation of Invention

In use, the azeotrope coolant is adjusted depending upon the desired coolant properties for a specific two-phase thermal management application. For example, the OS-120 azeotropic mixture may be suitable for a first application, but not suitable for a second application where the boiling point has to be increased or decreased. One or more of the added components are thereby adjusted to achieve a concentration that achieves the desired coolant properties. Other coolant properties may be altered and improved such as but not limited to thermal conductivity, flammability, specific gravity, viscosities, density, latent heat of vaporization, specific heat, surface tension, electrical conductivity and other properties.

After the azeotrope coolant is created to the desired specifications, the azeotrope coolant is then added to the two-phase thermal management system 10 such as shown in FIG. 1. FIG. 1 illustrates an exemplary two-phase thermal management unit that has an pump 20 fluidly connected between a coolant reservoir 50 and a thermal management unit 30 along with a heat exchanger 40 fluidly positioned between the thermal management unit 30 and the coolant reservoir 50 to form a closed loop. The thermal management unit 30 may utilize various two-phase thermal management technology such as but not limited to spray cooling, pool boiling, flow boiling, jet impingement cooling, falling-film cooling, parallel force convection, curved channel cooling and capillary pumped loops. The thermal management unit 30 is in thermal communication with a heat producing device 12 for thermally managing the same as further shown in FIG. 1.

During operation of the two-phase thermal management system 10 with the azeotrope coolant, a portion of the azeotrope coolant is phased changed to a vapor within the thermal management unit 30. The base component and the added component(s) within the azeotrope coolant evaporate at approximately the same temperature thereby retaining the same concentration of the added components(s) within the base component. The vaporized azeotrope coolant is comprised of the base component and the added component(s) at approximately the same concentration as azeotrope coolant in the liquid state. The vaporized azeotrope coolant enters the heat exchanger 40 which changes the phase of the vaporized azeotrope coolant to a liquid state. The azeotrope coolant enters the coolant reservoir 50 or is directly drawn into the pump 20, and continues back through the closed loop.

Although it is possible that the user of the thermal management system may optimize the concentration of azeotropic mixtures by field adding fluid components into the two-phase thermal management system 10, it is anticipated that azeotropic mixtures will be mixed for a given application and then supplied to the field. It is also possible that an MSA will be field added or separated thereby altering the azeotrope as designed and used in the system. This may be done by the end user or designed to be done actively within the two-phase thermal management system 10. In either case, fluid may be routed through a filtration system (not shown) to remove an MSA, or an MSA may be injected from a reservoir (not shown) into the fluid loop of the two-phase thermal management system 10 to disrupt or change the already present azeotrope.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

We claim:

1. A closed loop two-phase thermal management system utilizing an azeotrope coolant, for providing thermal management of an electronic component, comprising:
   a closed loop two-phase thermal management system;
   wherein said two-phase thermal management system is comprised of a pump, a coolant reservoir fluidly connected to an inlet of said pump, a thermal management unit fluidly connected to an outlet of said pump, and a heat exchanger fluidly positioned between said thermal management unit and said coolant reservoir; and
   a volume of azeotrope coolant within said two-phase thermal management system having a base fluid and at least one added component, wherein said at least one added component has a thermal conductivity greater than 0.05 watts per meter Kelvin.

2. The two-phase thermal management system utilizing an azeotrope coolant of claim 1, wherein said two-phase thermal management system is comprised of a closed loop spray cooling system.

3. The two-phase thermal management system utilizing an azeotrope coolant of claim 1, wherein said thermal management unit is comprised of a spray cooling unit.

4. The two-phase thermal management system utilizing an azeotrope coolant of claim 1, wherein said base fluid is a dielectric fluid.

5. The two-phase thermal management system utilizing an azeotrope coolant of claim 4, wherein said base fluid is methylsiloxane, or any combination thereof.

6. The two-phase thermal management system utilizing an azeotrope coolant of claim 1, wherein said at least one added component is an alcohol.

7. The two-phase thermal management system utilizing an azeotrope coolant of claim 1, wherein said thermal management unit utilizes a two-phase thermal management technology comprised of spray cooling, pool boiling, flow boiling, jet impingement cooling systems, falling film cooling, parallel force convection, curved channel cooling, or capillary pumped loop.

8. The two-phase thermal management system utilizing an azeotrope coolant of claim 1, wherein said azeotrope coolant is comprised of a base component and at least one added component.

9. The two-phase thermal management system utilizing an azeotrope coolant of claim 8, wherein said base component is comprised of methylsiloxane, siloxane, hydrofluorocarbon, fluoroiodocarbon, or water.

10. The two-phase thermal management system utilizing an azeotrope coolant of claim 8, wherein said at least one added component is comprised of alcohol, isopropyl alcohol, ethanol, methanol, trans-1,2-dichloroethylene, or benzene.

11. The two-phase thermal management system utilizing an azeotrope coolant of claim 1, wherein said azeotrope coolant is comprised of methylsiloxane and alcohol.

12. The two-phase thermal management system of claim 1, wherein said closed loop two-phase thermal management system thermally manages one or more electrical devices.

13. The two-phase thermal management system of claim 1, wherein said volume of azeotrope coolant is in an azeotrope state within a first portion of said closed loop two-phase thermal management system and in a zeotrope state within a second portion of said closed loop two-phase thermal management system.

14. A closed loop two-phase thermal management system utilizing an azeotrope coolant, for providing thermal management of an electronic component, comprising:
a closed loop two-phase thermal management system; and
a volume of azeotrope coolant within said two-phase thermal management system having a base fluid and at least one added component;
wherein said base fluid is methylsiloxane.

15. A closed loop two-phase thermal management system utilizing an azeotrope coolant, for providing thermal management of an electronic component, comprising:
a closed loop two-phase thermal management system; and
a volume of azeotrope coolant within said two-phase thermal management system having a base fluid and at least one added component;
wherein said at least one added component has a thermal conductivity greater than 0.05 watts per meter Kelvin.

16. The two-phase thermal management system utilizing an azeotrope coolant of claim 15, wherein said at least one added component is an alcohol.

17. A closed loop two-phase thermal management system utilizing an azeotrope coolant, for providing thermal management of an electronic component, comprising:
a closed loop two-phase thermal management system; and
a volume of azeotrope coolant within said two-phase thermal management system having a base fluid and at least one added component;
wherein said azeotrope coolant is comprised of a base component and at least one added component.

18. The two-phase thermal management system utilizing an azeotrope coolant of claim 17, wherein said base component is comprised of methylsiloxane, siloxane, hydrofluorocarbon, fluoroiodocarbon, or water.

19. The two-phase thermal management system utilizing an azeotrope coolant of claim 17, wherein said at least one added component is comprised of alcohol, isopropyl alcohol, ethanol, methanol, trans-1,2-dichloroethylene, or benzene.

20. A closed loop two-phase thermal management system utilizing an azeotrope coolant, for providing thermal management of an electronic component, comprising:
a closed loop two-phase thermal management system; and
a volume of azeotrope coolant within said two-phase thermal management system having a base fluid and at least one added component;
wherein said azeotrope coolant is comprised of methylsiloxane and alcohol.

21. A closed loop two-phase thermal management system utilizing an azeotrope coolant, for providing thermal management of an electronic component, comprising:
a closed loop two-phase thermal management system; and
a volume of azeotrope coolant within said two-phase thermal management system having a base fluid and at least one added component;
wherein said volume of azeotrope coolant is in an azeotrope state within a first portion of said closed loop two-phase thermal management system and in a zeotrope state within a second portion of said closed loop two-phase thermal management system.

* * * * *